United States Patent
Nogami

[11] Patent Number: 5,879,170
[45] Date of Patent: Mar. 9, 1999

[54] PC CARD FRAME KIT AND PC CARD

[75] Inventor: Daisuke Nogami, Tokyo, Japan

[73] Assignee: Hirose Electric Co., Ltd., Tokyo, Japan

[21] Appl. No.: 903,988

[22] Filed: Jul. 31, 1997

Related U.S. Application Data

[62] Division of Ser. No. 754,402, Nov. 21, 1996, Pat. No. 5,780,365.

[30] Foreign Application Priority Data

Nov. 30, 1995 [JP] Japan .................................... 7-334341

[51] Int. Cl.$^6$ ..................................................... H01R 9/09
[52] U.S. Cl. ........................................... 439/76.1; 361/737
[58] Field of Search ................................. 439/76.1, 946; 361/737, 736, 752, 816, 818; 174/35 R

[56] References Cited

U.S. PATENT DOCUMENTS 5,490,043  2/1996  Tan et al. .................................. 439/946
5,563,450  10/1996  Bader et al. .............................. 361/737

FOREIGN PATENT DOCUMENTS 2247109  2/1992  United Kingdom ................... 361/737

*Primary Examiner*—Paula Bradley
*Assistant Examiner*—Tho Dac Ta
*Attorney, Agent, or Firm*—Kanesaka & Takeuchi

[57] ABSTRACT

A PC card frame kit includes an insulating frame holder (4, 5) for supporting a board assembly; a pair of metal panels (10, 11) able to be joined together for completely covering upper and lower sides of the board assembly; engaging members (12A, 13A, 10A; 14A, 15A, 16A) for preventing separation of the metal panels; and resilient members (6E, 8E) for biasing the metal panels in opposite directions to minimize play of the metal panels.

3 Claims, 8 Drawing Sheets

PC CARD FRAME KIT AND PC CARD

This application is a division of application Ser. No. 754,402 filed Nov. 21, 1996 which application is now U.S. Pat. No. 5,780,365.

BACKGROUND OF THE INVENTION

1. Field of the Invention

The present invention relates to frame kits for PC cards and assembled PC cards.

2. Description of the Related Art

Japanese patent application Kokai No. 309517/94 discloses a frame kit of this type and a PC card.

FIG. 10 shows such a PC card 50 which includes an upper cover member 51, a lower cover member 52, a frame 53, and a memory card (circuit board) 54. The upper and lower cover members 51 and 52 are made by bending and forming a metal sheet such that the upper cover member 51 has an end portion 51A and side portions 51B with a C-shaped cross-section and the lower cover member 52 has an end portion 52A molded in the frame 53. The frame 53 has a shoulder 53A for supporting the memory card 54 and a rounded engaging projection 53B.

As shown in FIG. 11, the memory card 54 is mounted on the shoulder 53A of the frame 53, and the cover member 51 is joined with the frame 53. The rounded engaging projection 53B facilitates the cover member 51 to snap the frame 53 to shield the memory card 54 on all sides. The leading edge of the C-shaped end portion 51A is brought into contact with the end portion 52A of the lower cover member 52 for electrically connecting both of the cover members 51 and 52.

In general, formed parts have dimensional errors. Especially, the cover members 51 and 52 made by bending and forming have relatively large errors in the direction of thickness of the PC card. Consequently, the PC card wherein the upper cover 51 merely snaps the frame 53 at the engaging end 53B can permit large play of the upper and lower cover members 51 and 52.

Such large play makes the user uncomfortable and permits the upper and lower cover members to readily separate when the PC card is dropped, for example, and unstable the electrical connection between the upper and lower cover members.

SUMMARY OF THE INVENTION

Accordingly, it is an object of the invention to provide a PC card frame kit and a PC card wherein the upper and lower cover members (panels) are connected reliably mechanically and electrically.

According to one aspect of the invention there is provided a PC card frame kit which includes an insulating frame holder for supporting a board assembly; a pair of metal panels able to be joined together for completely covering upper and lower sides of the board assembly; engaging members for preventing separation of the metal panels; and resilient members for biasing the metal panels in opposite directions to minimize play of the metal panels.

According to another aspect of the invention there is provided a PC card which includes the above frame kit and a board assembly incorporated in the frame holder by joining the panels together.

The metal panels are biased by the resilient members in opposite directions so that not only play of the metal panels is minimized but also the electrical connection is stabilized.

DESCRIPTION OF THE PREFERRED EMBODIMENT

Figure 1:
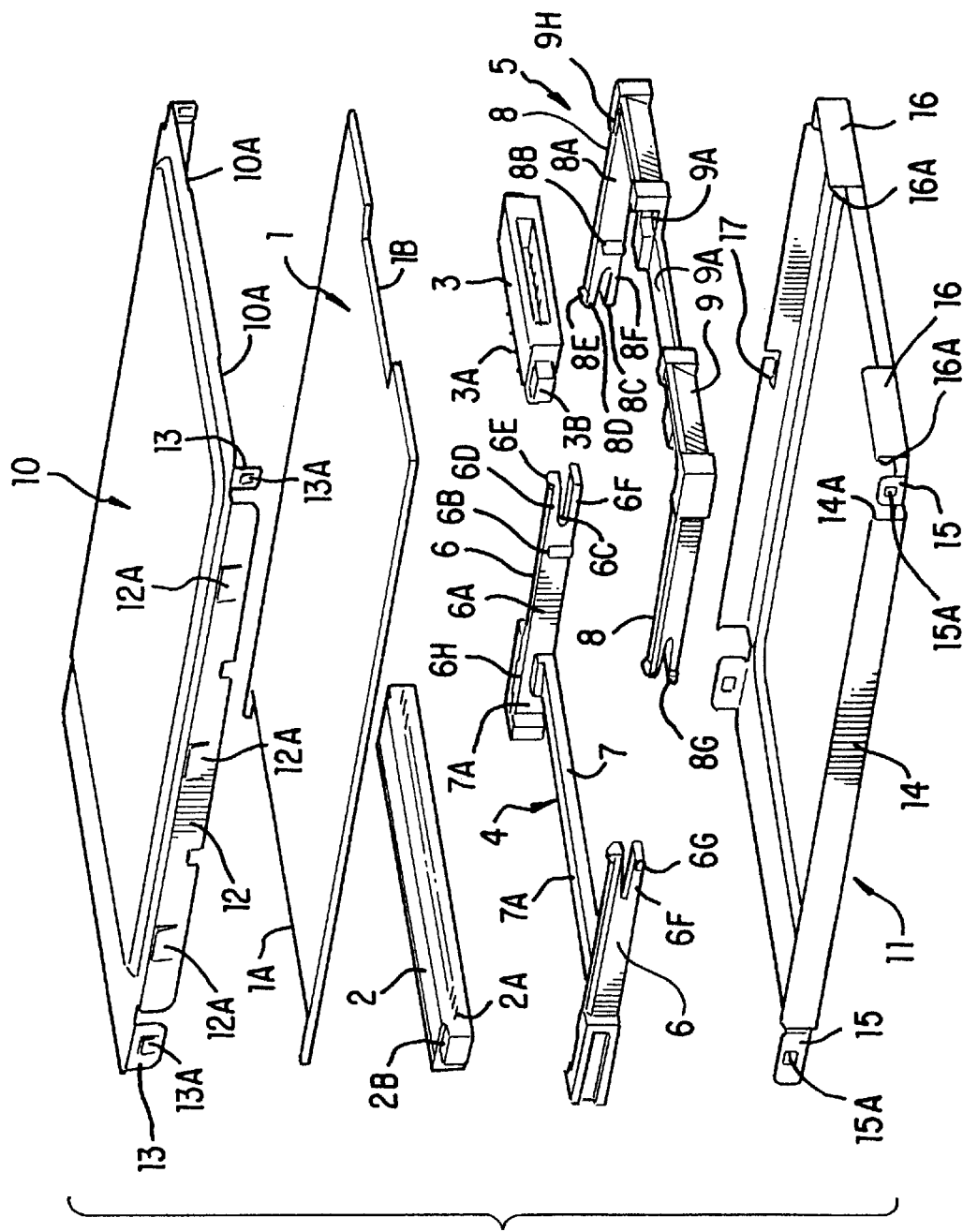
FIG. 1 is an exploded perspective view of a PC card according to an embodiment of the invention.

In FIG. 1, a circuit board (memory card) 1 has a pair of cutouts 1A and 1B at the front and rear ends for receiving connectors 2 and 3.

A plurality of contact elements 2A or 3A are provided through the connector 2 or 3 and connected at one end to the corresponding conductors of the circuit board 1 and are able to be connected at the other end to other equipment. A pair of attaching sections 2B or 3B extend outwardly from opposite sides of the connector 2 or 3 and are secured to opposite edges of the cutout 1A or 1B with fasteners, such as screws. The circuit board 1 and the attached connectors 2 and 3 constitute a board assembly.

A front frame 4 and a rear frame 5 constitute a frame holder to support the board assembly. The front frame 4 has an H-shaped form while the rear frame has a C-shaped form as viewed from top.

The front frame 4 has a pair of side beams 6 and a lateral beam 7 for linking the side beams 6. The side beams 6 have a guide face 6A on their inner side for guiding the circuit board 1 and a support projection 6B for supporting the circuit board 1. A slot 6C is provided on an inside end of each side beam 6 to form an upper flexible arm 6D which has a resilient projection 6E on its tip. A lower arm 6F has an outside projection 6G on its outer side. A slit 6H is provided through an outside end of each side beam 6.

The upper surface of the lateral beam 7 is set below the upper surfaces of the side beams 6 to form guide recesses 7A on the sides of the lateral beam 7 and the side beams 6 for receiving attaching sections 2B of the connector 2.

The rear frame 5 also has a pair of parallel side beams 8 and a lateral beam 9 for linking the side beams 8. Similarly to the side beams 6, the side beams 8 of the rear frame 5 have a guide face 8A, a support projection 8B, a slot 8C, a flexible arm 8D, resilient projection 8E, a lower arm 8F, and an outside projection 8G. The middle portion of the lateral beam 9 is depressed to form a pair of guide recesses 9A for receiving protruded sections 3B of the connector 3. A pair of slits 9H are provided through the side beams 8 adjacent to the lateral beam 9.

Upper and lower panels 10 and 11 constitute a metal shell. The upper panel 10 is substantially flat and side edges bent downwardly to provide upper major side faces 12 and a pair of upper minor side faces 13 on opposite sides of each upper major side face 12. Three major engaging tabs 12A are provided on each upper major side face 12 while a minor engaging tab 13A is provided on each upper minor side face 13. These engaging tabs extend diagonally upwardly and outwardly.

The lower panel 11 is also substantially flat and has side and an end edges bent upwardly to provide lower major side faces 14 and a pair of lower minor side faces 15 on opposite sides of each lower major side face 14 and a lower end face 16. The edges 14A of the lower major side faces 14 are bent inwardly while the lower minor side faces 15 are provided with square engaging hole 15A. The upper edge 16A of the end face 16 is also bent inwardly. The major engaging tabs 12A of the upper panel 10 and the upper edge 14A of the lower panel 11, the minor engaging tabs 13A of the upper panel 10 and the engaging holes 15A of the lower panel 11, and the lateral beam 9 of the rear frame 5 and upper edges 16A of the lower panel 11 engage each other to provide three separation preventive means.

A part of one of the lower major side faces 14 is cut and bent inwardly to form a contact piece 17 which extends diagonally upwardly.

A set of the front and rear frames 4 and 5, and the upper and lower panels 10 and 11 is traded as a frame kit for PC card, and the user assembles the connectors 2 and 3 and the circuit board 1 to form a board assembly and then the board assembly and the frame kit to provide a PC card.

How to assemble the PC card will be described with respect to FIGS. 2–7.

Figure 2:
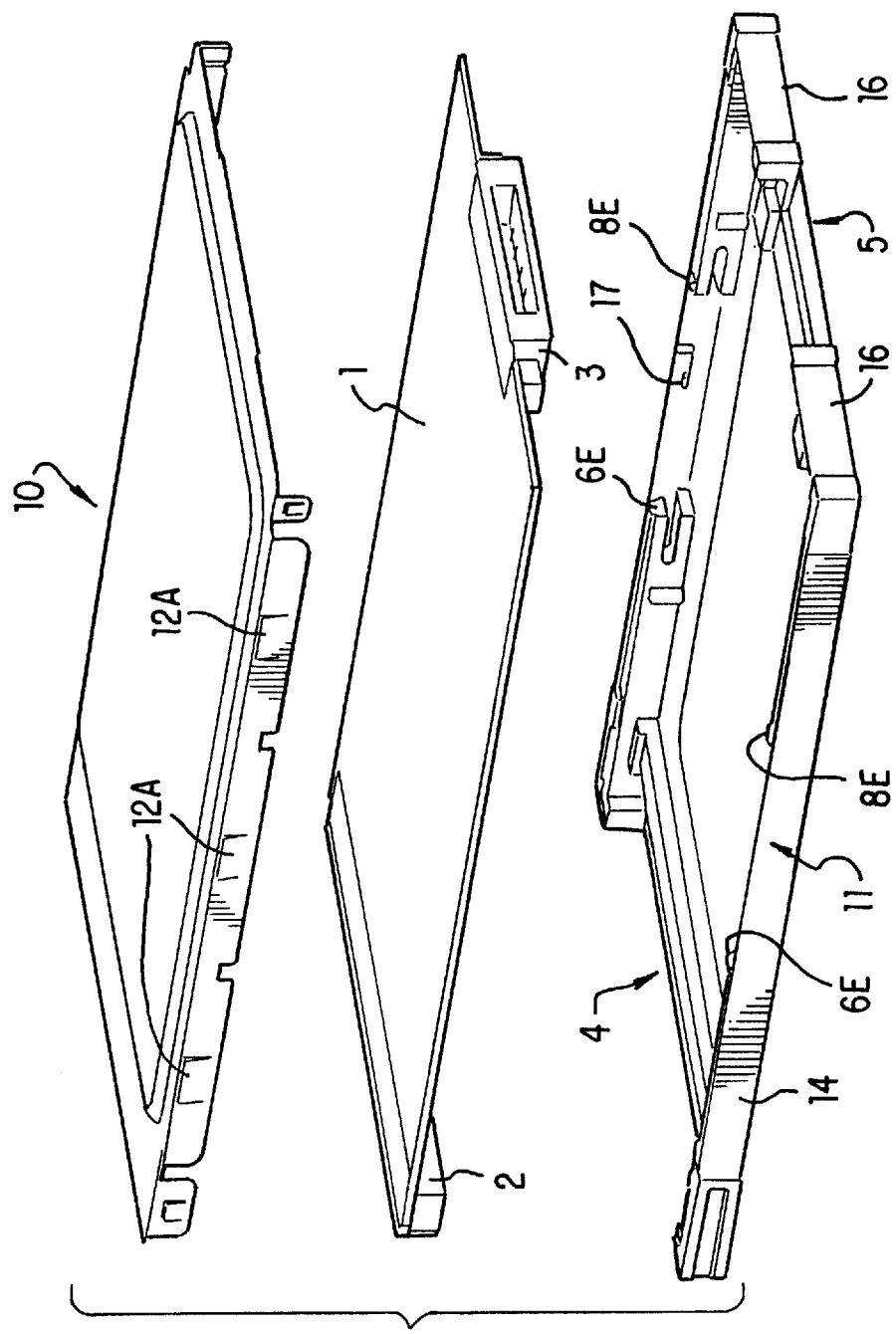
FIG. 2 is an exploded perspective view of the PC card wherein connectors are attached to a circuit board and front and rear frames are incorporated in a lower panel.

(1) As shown in FIG. 2, the connectors 2 and 3 are attached to the front and rear ends of the circuit board 1 to provide a board assembly.

Figure 6:
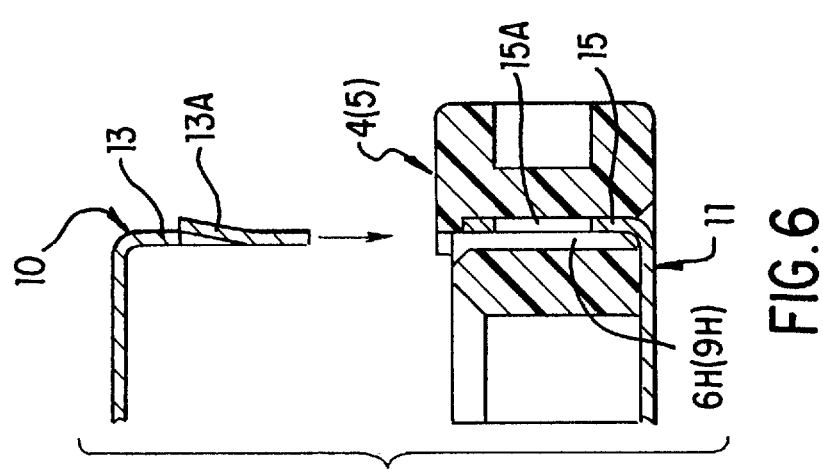
Figure 5:
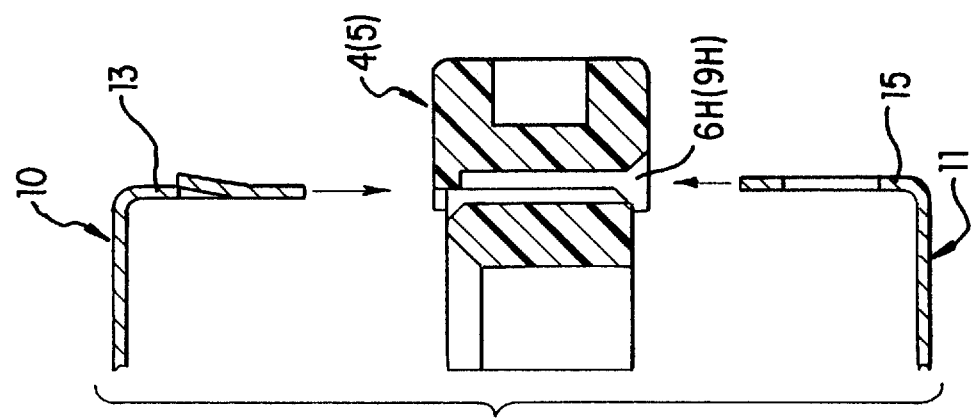

(2) The front and rear frames 4 and 5 are fitted in the lower panel 11 such that the lower minor side faces 15 are fitted into the slits 6H and 9H of the front and rear frames 4 and 5 as shown in FIGS. 5 and 6. The slits 6H and 9H are dimensioned approximately twice the thickness of the lower minor side faces 15 so that there are still spaces inside the slits 6H and 9H (see FIG. 6). The lower major side faces 14 and the lower end face 16 are opposed to the front and rear frames 4 and 5 such that there are provided spaces between the lower side faces 14 of the lower panel 11 and the side beams 6 and 8 of the front and rear frames 4 and 5 by means of the outside projections 6G and 8G, respectively. The spaces are made sufficiently large to accommodate the major engaging pieces 12A of the upper panel 10 without deformation. When the front and rear frames 4 and 5 are fitted in the lower panel 11, the resilient projections 6E and 8E on the front and rear frames 4 and 5 project slightly beyond the upper edge of the lower side faces 14 of the lower panel 11.

Figure 3:
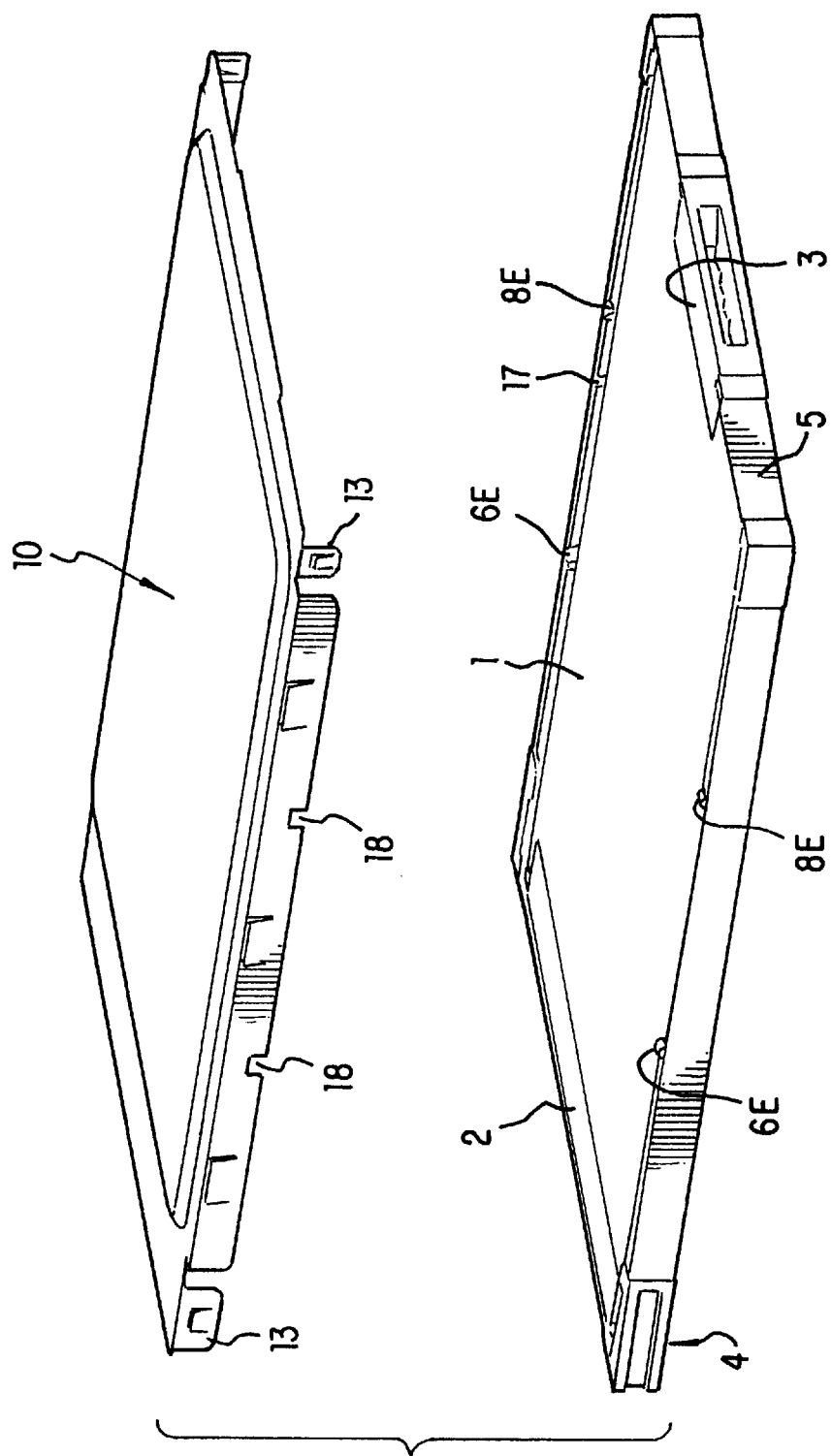
FIG. 3 is an exploded perspective view of the PC card assembled except for an upper panel.
Figure 4:
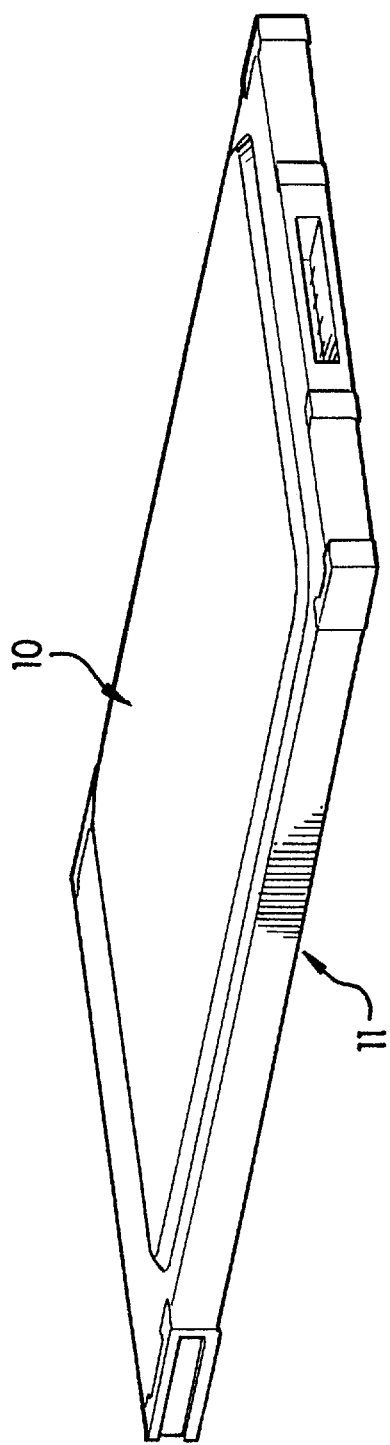
FIG. 4 is a perspective view of the completed PC card.

(3) As shown in FIG. 3, the board assembly is mounted on the front and rear frames 4 and 5 such that the connectors 2 and 3 are disposed on the upper face 7A of the lateral beam 7 and the depression 9A of the lateral beam 9, respectively, while the circuit board 1 is supported by the support projections 6B and 8B of the front and rear frames 4 and 5, respectively. The resilient projections 6E and 8E of the front and rear frames 4 and 5 project upwardly beyond the circuit board 1 with the spaces from the lower major side faces 14 of the lower panel 11 produced by the side projections 6G and 8G. The contact piece 17 of the lower panel 11 is brought into contact with a ground section of the circuit board 1.

Figure 7:
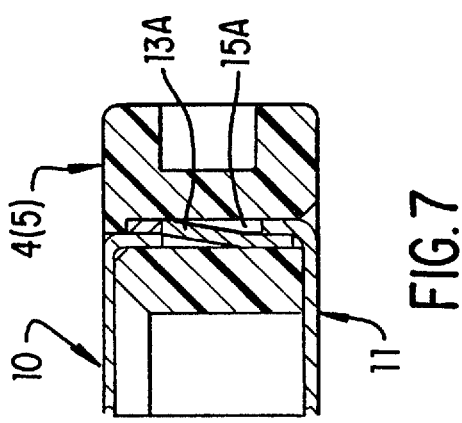
FIGS. 5–7 are sectional views showing how to connect engaging members.

(4) As shown in FIG. 7, the upper panel 10 is joined with the lower panel 11 to complete a PC card by fitting the upper minor side faces 13 in the remaining spaces of the slits 6H and 9H so that the minor engaging pieces 13A engage the engaging holes 15A of the lower panel 11 while the upper engaging pieces 12A and an edge 10A of the upper panel 10 engage the upper edges 14A and 16A of the lower panel 11. When the upper and lower panels 10 and 11 are joined together, the upper panel 10 is biased upwardly by the resilient projections 6E and 8E of the front and rear frames 4 and 5 so that there is no play of the upper and lower panels 10 and 11. Escape notches 18 are provided in the upper major side faces 12 at positions corresponding to the projections 6G and 8G of the front and rear frames 4 and 5 to permit the connection of the upper and lower panels 10 and 11 without difficulty.

Figure 8:
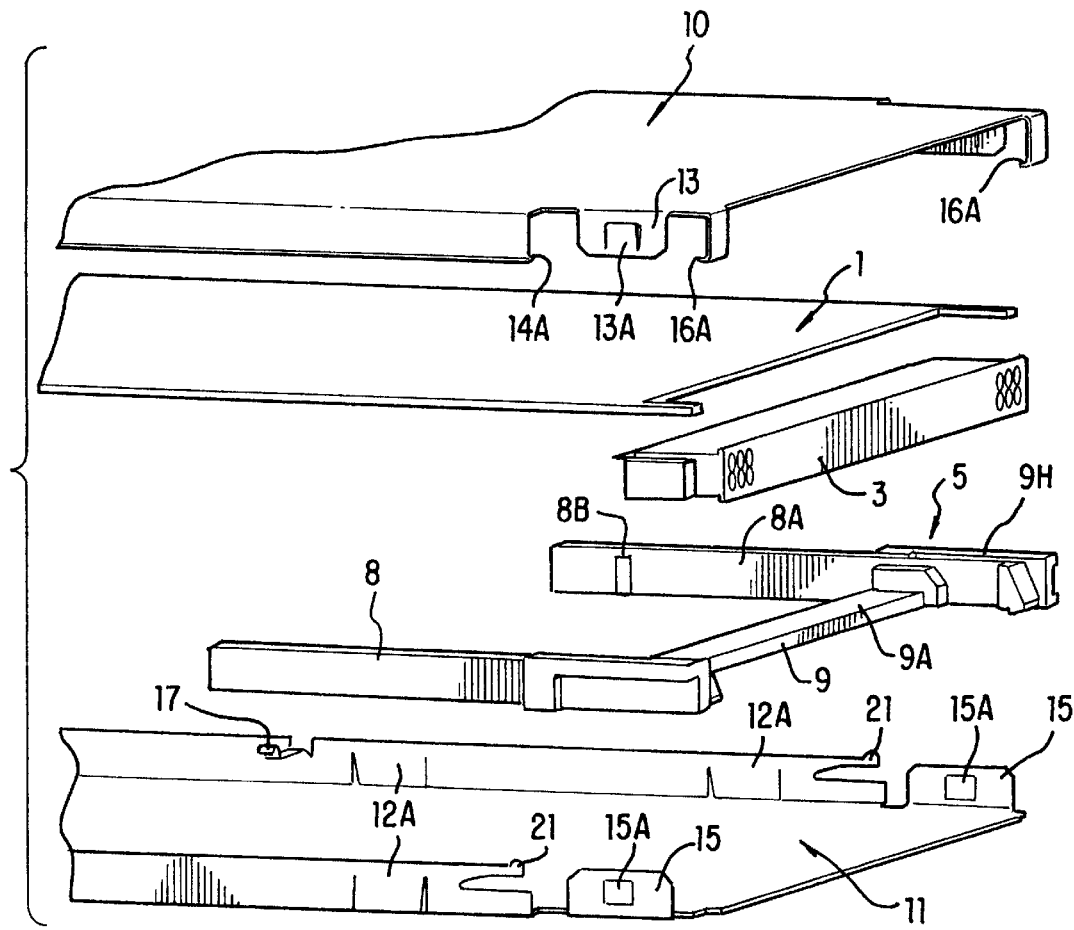
FIG. 8 is an exploded perspective view of a PC card according to another embodiment of the invention.
Figure 9:
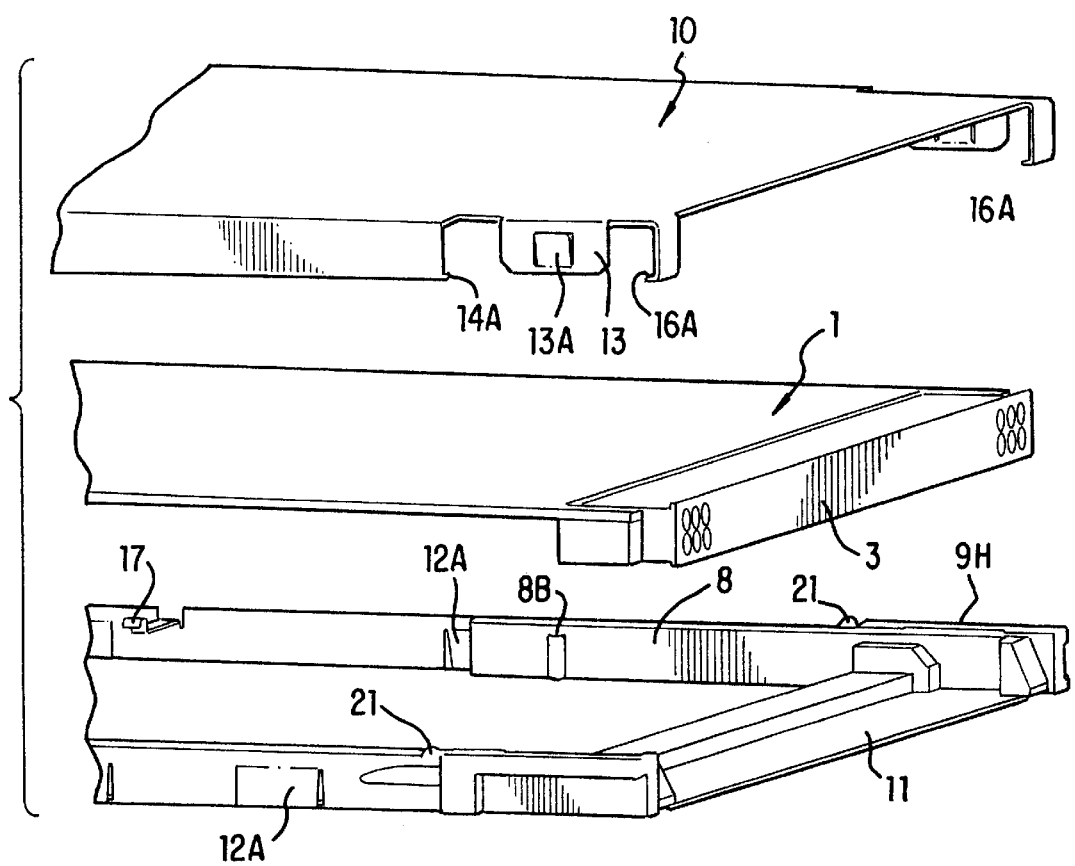
FIG. 9 is an exploded perspective view of the PC card of FIG. 8 under conditions corresponding to those of FIG. 2.
Figure 10:
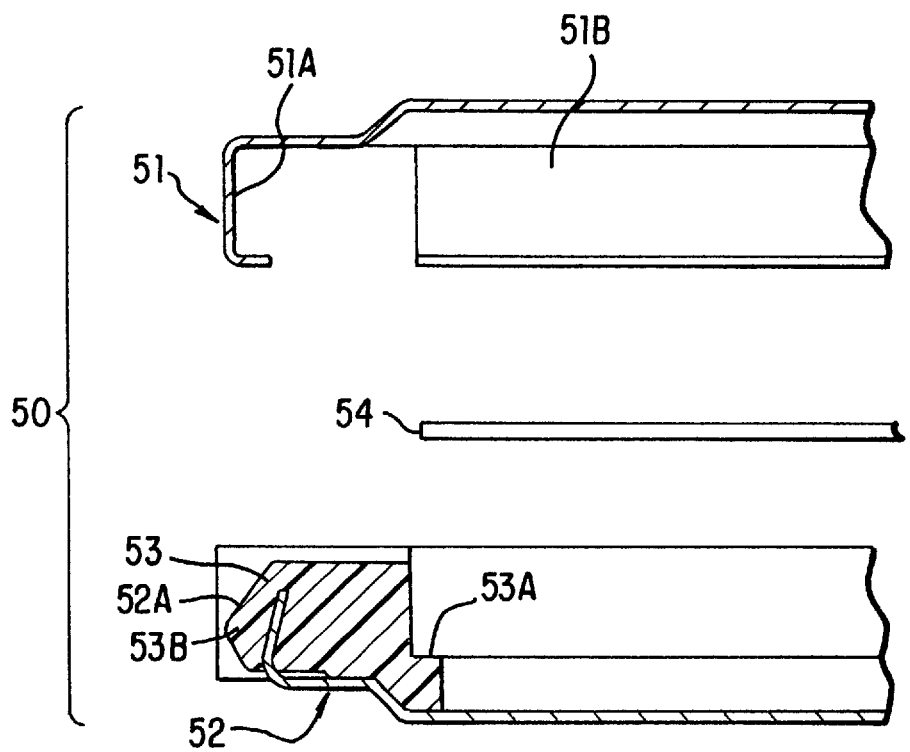
FIG. 10 is an exploded sectional view of part of a conventional PC card.
Figure 11:
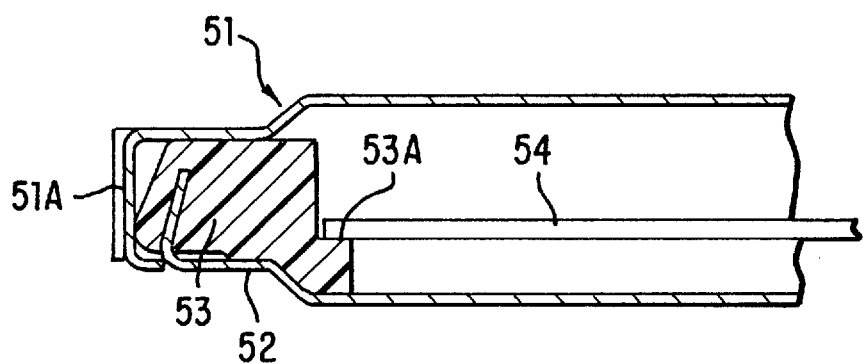
FIG. 11 is a sectional view of the part of the assembled PC card of FIG. 10.

Alternatively, the resilient projections of the front and rear frames may be replaced by those of the lower panel as shown in FIGS. 8 and 9.

In FIG. 9, a pair of resilient arms 21 are provided in the lower major side faces 14 such that when the upper and lower panels 10 and 11 are put together, they push upwardly the upper panel 10. The upper engaging pieces 12A and the edge 10A of the upper panel 10 and the upper edge 14A and 16A of the lower panel 11 are reversed with respect to those of the above embodiment.

The conditions of this embodiment corresponding to those of FIG. 2 is shown in FIG. 9.

As has been described above, according to the invention, the upper and lower panels are biased with the resilient members in opposite directions so as to not only eliminate play of the panels and separation of the panels when the PC card is dropped but also stabilize the electrical connection between the panels thereby increasing the reliability of the PC card.

What is claimed is:

1. A PC card frame kit comprising:

an insulating frame holder for supporting a board assembly;

a pair of metal panels able to be joined together for completely covering upper and lower sides of said board assembly;

engaging means integrally provided at side walls of said metal panels for preventing separation of said metal panels; and resilient means integrally provided at side walls of one of said metal panels such that when said metal panels are joined together, said resilient means bias the other of said metal panels to minimize play of said metal panels, wherein each of said resilient means is formed in a one-piece construction with each of said side walls.

2. A PC card comprising:

a frame holder of claim 1; and a board assembly put in said frame holder, with said upper and lower metal panels joined together.

3. A PC card frame kit according to claim 1, wherein said resilient means is accommodated in a space defined by opposed side walls of one of said metal panels with a gap between said opposed side walls and said side beams of said frame holder so as to bias the other metal panel in a direction of separation of these metal panels.

* * * * *